United States Patent
Kurita et al.

(10) Patent No.: US 7,018,517 B2
(45) Date of Patent: Mar. 28, 2006

(54) TRANSFER CHAMBER FOR VACUUM PROCESSING SYSTEM

(75) Inventors: Shinichi Kurita, San Jose, CA (US); Emanuel Beer, San Jose, CA (US); Hung T. Nguyen, Fremont, CA (US); Wendell T. Blonigan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/601,185

(22) Filed: Jun. 20, 2003

(65) Prior Publication Data

US 2004/0055537 A1 Mar. 25, 2004

Related U.S. Application Data

(60) Provisional application No. 60/390,629, filed on Jun. 21, 2002, provisional application No. 60/392,578, filed on Jun. 28, 2002.

(51) Int. Cl.
*C23C 14/34* (2006.01)
*C23C 16/00* (2006.01)

(52) U.S. Cl. .......................... 204/298.25; 204/192.12; 118/719; 156/345.31; 156/345.32; 414/217; 414/222.07; 414/935; 427/255.5

(58) Field of Classification Search ........... 204/298.25, 204/192.12; 118/719; 156/345.31, 345.32; 414/217, 222.07, 935; 427/255.5
See application file for complete search history.

(56) References Cited

U.S. PATENT DOCUMENTS

| 4,455,177 | A | 6/1984 | Filippov et al. |
| 4,632,624 | A | 12/1986 | Mirkovich et al. |
| 4,790,750 | A | 12/1988 | Bourel et al. |
| 5,085,887 | A | 2/1992 | Adams et al. |
| 5,421,957 | A | 6/1995 | Carlson et al. |
| 6,019,839 | A | 2/2000 | Achutharaman et al. |
| 6,093,252 | A | 7/2000 | Wengert et al. |
| 6,099,697 | A | 8/2000 | Hausmann |
| 6,286,451 | B1 | 9/2001 | Ishikawa et al. |
| 6,326,597 | B1 | 12/2001 | Lubomirsky et al. |
| 6,383,330 | B1 | 5/2002 | Raaijmakers |
| 6,390,019 | B1 | 5/2002 | Grimbergen et al. |

FOREIGN PATENT DOCUMENTS

EP 0 928 014 A2 7/1999
EP 1 065 701 A2 1/2001

*Primary Examiner*—Rodney G. McDonald
(74) *Attorney, Agent, or Firm*—Dugan & Dugan

(57) ABSTRACT

A transfer chamber for a substrate processing tool includes a main body having side walls adapted to couple to at least one processing chamber and at least one load lock chamber. The main body houses at least a portion of a robot adapted to transport a substrate between the processing chamber and the load lock chamber. A lid couples to and seals a top of the main body of the transfer chamber. The transfer chamber also has a domed bottom adapted to couple to and to seal a bottom portion of the main body of the transfer chamber.

30 Claims, 5 Drawing Sheets

TRANSFER CHAMBER FOR VACUUM PROCESSING SYSTEM

The present application claims priority from U.S. Provisional Patent Application Ser. No. 60/390,629, filed Jun. 21, 2002, and titled "Transfer Chamber For Vacuum Processing System" and from U.S. Provisional Patent Application Ser. No. 60/392,578, filed Jun. 28, 2002, and titled "Transfer Chamber For Vacuum Processing System", both of which are hereby incorporated by reference herein in their entirety.

FIELD OF THE INVENTION

This invention is generally concerned with processing systems used for processing substrates, and is more particularly concerned with a transfer chamber for use in such a system.

BACKGROUND OF THE INVENTION

Conventional techniques for manufacturing flat panel displays or semiconductor devices entail applying a sequence of processes to a substrate such as a glass plate or a silicon wafer. The processes to be applied may include thermal processing, physical vapor deposition (PVD), chemical vapor deposition (CVD), etching, etc. Typically, each process in the sequence of processes is performed in a respective processing chamber. Accordingly, the substrates upon which the processes are performed must be transferred from one processing chamber to another.

It is also conventional to incorporate a number of different processing chambers in a single processing tool, wherein the processing chambers are coupled around the periphery of a central transfer chamber. FIG. 1 is a somewhat schematic vertical cross-sectional view of a conventional processing tool 11. The processing tool 11 includes a centrally-positioned transfer chamber 13. A load lock chamber 15 and a processing chamber 17 are shown coupled to respective sides of the transfer chamber 13. One or more additional process chambers and/or load lock chambers, which are not shown, may also be coupled to respective sides of the transfer chamber 13. The load lock chamber 15 is provided to accommodate introduction of substrates into the processing tool 11 from outside of the processing tool 11.

The transfer chamber 13 includes a main body 19 having side walls 21 (of which only two are visible in FIG. 1). Each side wall 21 may be adapted to have a load lock or processing chamber coupled thereto. The transfer chamber 13 also includes a top 23 supported on the main body 19. A lid 25 is provided to sealingly close the top 23 of the transfer chamber 13.

A lower end of the transfer chamber 13 is closed by a substantially annular bottom 27. The bottom 27 of the transfer chamber 13 has a central aperture 29 which accommodates installation of a substrate handling robot 31 in the transfer chamber 13. The substrate handling robot 31 is adapted to transfer substrates among the processing chambers 17 and the load lock chamber or chambers 15 coupled to transfer chamber 13.

To minimize the possibility of contamination of substrates processed in the processing tool 11, it is customary to maintain a vacuum in the interior of the transfer chamber 13. Hence, the processing tool 11 may be referred to as a vacuum processing system. A pumping system, which is not shown, may be coupled to the transfer chamber 13 to pump the transfer chamber 13 down to a suitable degree of vacuum.

Also illustrated in FIG. 1 is an actuator 33 which selectively opens and closes a slit valve 35 associated with the processing chamber 17. When the slit valve 35 is in an open position (not shown), a substrate may be introduced into or removed from the processing chamber 17. When the slit valve 35 is in the closed position illustrated in FIG. 1, the processing chamber 17 is isolated from the transfer chamber 13 so that a fabrication process may be performed on a substrate within the processing chamber 17.

Processing tools, and in particular the transfer chamber portions thereof, are manufactured in a variety of sizes. In some cases it is necessary or desirable that the transfer chamber 13 be quite large. For example, in a processing tool used for fabricating flat panel displays, the glass plate substrates that are processed currently range from about 0.5 to 1.5 meters per side, and may reach 2–3 meters per side in the near future. Accordingly, a very large transfer chamber is required for such applications. In addition, it may be desirable to increase the number of processing chambers and/or load locks included in the processing tool, which also may require that the transfer chamber be made large. However, increasing the size of a transfer chamber increases vacuum induced stresses in components thereof such as the bottom of the transfer chamber. To accommodate such stresses, the thickness of the bottom of a transfer chamber may be increased to provide increased strength. However, increased thickness of the transfer chamber bottom results in greater weight, increased difficulty in manufacture, and higher cost.

SUMMARY OF THE INVENTION

According to a first aspect of the invention, a transfer chamber is provided, including a main body having side walls adapted to couple to at least one processing chamber and at least one load lock chamber. The main body is also adapted to house at least a portion of a robot adapted to transport a substrate between the at least one processing chamber and the at least one load lock chamber. The inventive transfer chamber also includes a lid adapted to couple to and to seal a top portion of the main body of the transfer chamber. The inventive transfer chamber further includes a domed bottom adapted to couple to and to seal a bottom portion of the main body of the transfer chamber.

According to a second aspect of the invention, a vacuum processing system includes a transfer chamber as described above in connection with the first aspect of the invention. The inventive vacuum processing system also includes at least one processing chamber coupled to the main body of the transfer chamber and at least one load lock chamber coupled to the main body of the transfer chamber. The inventive vacuum processing system further includes a robot that at least partially extends through the domed bottom into the transfer chamber. The robot is adapted to transport a substrate between the at least one processing chamber and the at least one load lock chamber via the transfer chamber.

According to a third aspect of the invention, a method of forming a domed bottom for a transfer chamber is provided. The transfer chamber is adapted to couple at least one load lock chamber to at least one processing chamber. The method includes selecting a material and forming a domed bottom from the material. The domed bottom has an outer diameter sized to fit against and configured to form a seal with a bottom portion of a main body of a transfer chamber. The domed bottom also has an aperture having a diameter sized to accommodate at least a portion of a robot. The robot is adapted to transfer substrates between at least one load lock chamber and at least one processing chamber coupled to the transfer chamber.

Because the transfer chamber bottom provided in accordance with the invention has a domed configuration, the inventive transfer chamber bottom exhibits greater strength than would a transfer chamber bottom of equal thickness having a flat configuration. Accordingly, the inventive transfer chamber bottom may be made thinner than conventional flat bottoms of transfer chambers of comparable size, thereby providing savings in cost and weight.

Further features and advantages of the present invention will become more fully apparent from the following detailed description of exemplary embodiments, the appended claims and the accompanying drawings.

DETAILED DESCRIPTION

In accordance with the invention, the bottom of a transfer chamber is provided in a domed configuration, thereby achieving greater strength for a given thickness of the bottom and reducing the interior volume of the transfer chamber. As a result, the bottom of the transfer chamber may be made thinner than conventional transfer chamber bottoms, so that a savings in cost and weight is realized. The reduced interior volume of the transfer chamber also may decrease pump down times, thereby increasing throughput.

An embodiment of the invention will now be described with reference to FIGS. 2 and 3.

Figure 1:
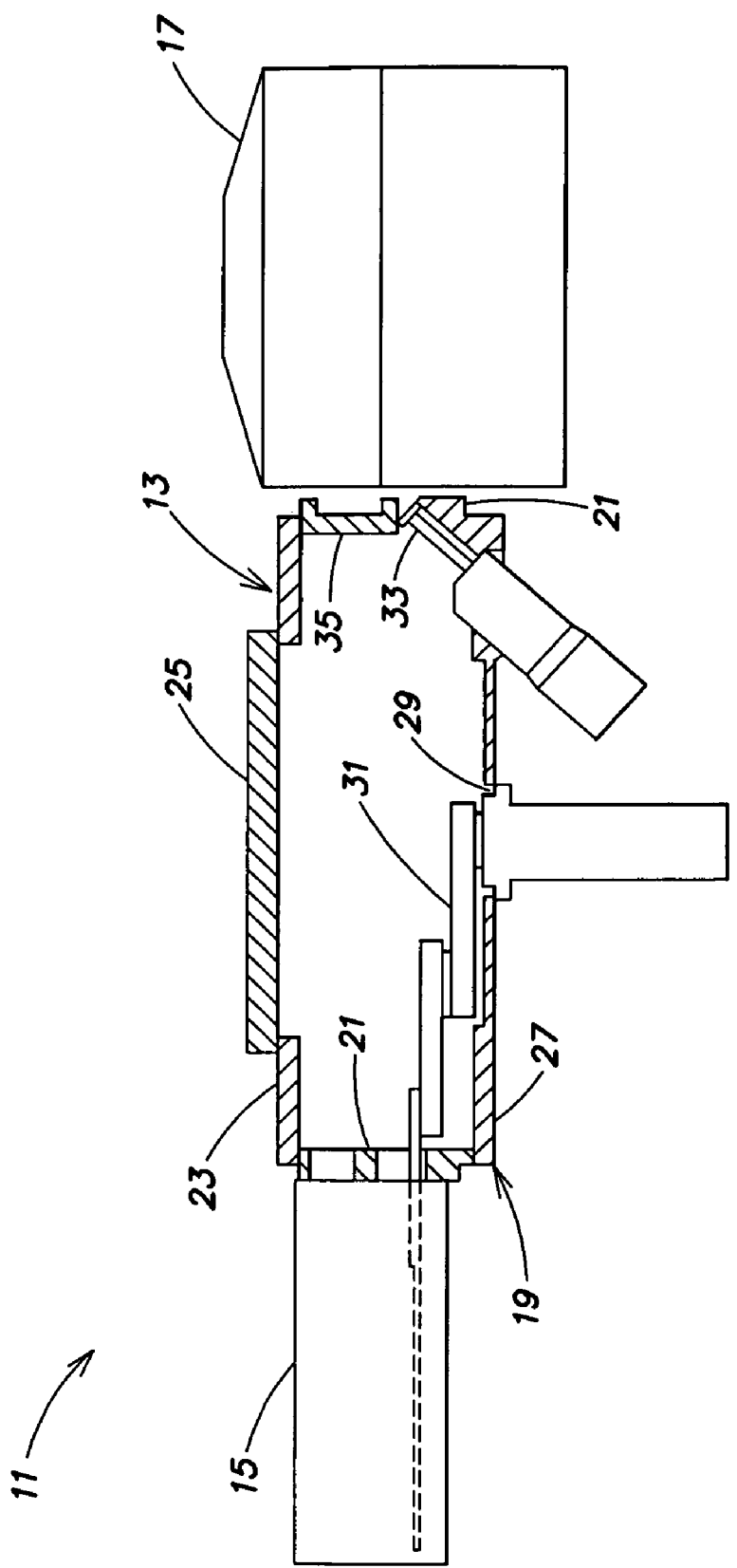
FIG. 1 is a vertical cross-sectional view of a conventional vacuum processing system.
Figure 2:
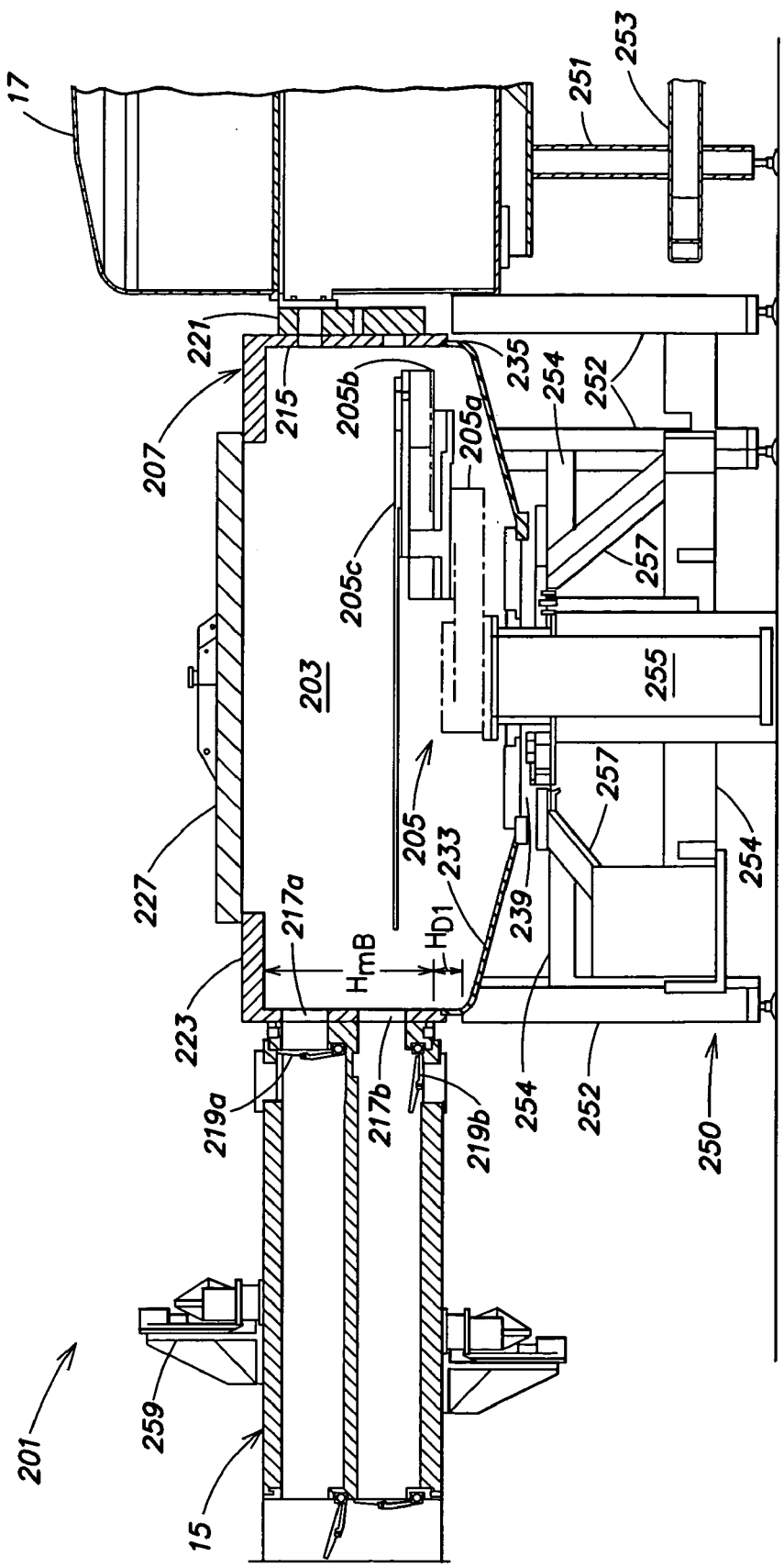
FIG. 2 is a vertical cross-sectional view of a vacuum processing system provided in accordance with a first embodiment of the invention.

FIG. 2 is a view similar to FIG. 1 of a processing tool (vacuum processing system) 201 provided in accordance with an embodiment of the present invention. The inventive processing tool 201 includes a novel transfer chamber 203. A conventional load lock chamber 15 (which may be, for example, a double dual slot load lock (DDSL) or other conventional load lock) and a conventional processing chamber 17 are shown coupled to the inventive transfer chamber 203. It will be understood that one or more additional process chambers and/or load lock chambers may also be coupled to the transfer chamber 203, although not shown in the drawings. A substrate handling robot 205 is disposed within the transfer chamber 203. As with the conventional system of FIG. 1, a pumping system (not shown) may be coupled to the inventive transfer chamber 203 to pump down the transfer chamber 203 to a suitable degree of vacuum. For convenience, the inventive transfer chamber 203 will be described with reference to both FIG. 2 and FIG. 3 (which is an exploded view of the inventive transfer chamber 203).

Figure 3:
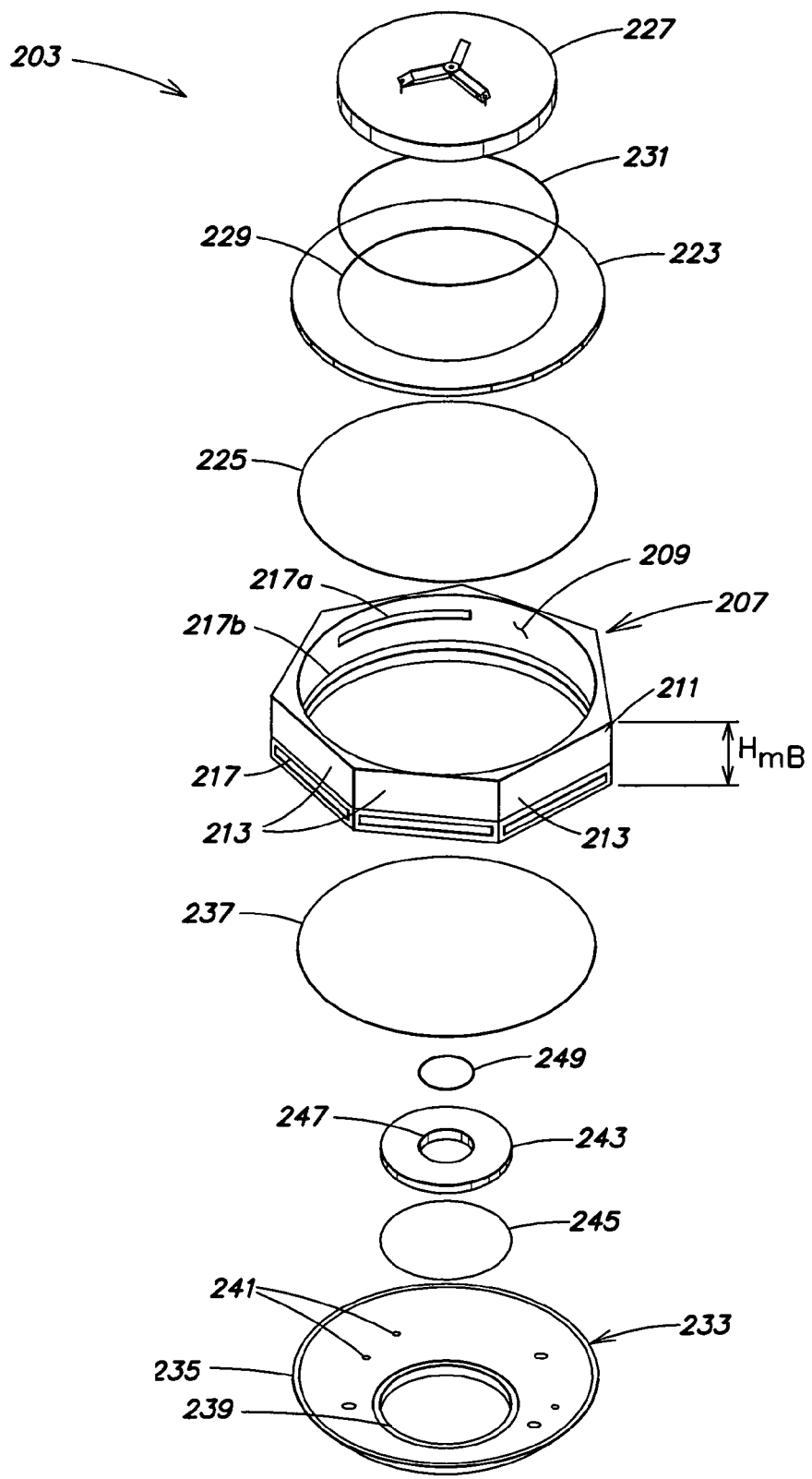
FIG. 3 is an exploded view of a transfer chamber that is part of the inventive vacuum processing system of FIG. 2.

With reference to FIGS. 2 and 3, the transfer chamber 203 includes a main body 207, which may be, for example, machined from a single piece of material such as aluminum. Other materials may be employed. As described further below, in at least one embodiment of the invention the height of the main body 207 ($H_{mB}$) is minimized so as to reduce the overall volume and weight of the transfer chamber 207. The main body 207 may have a cylindrical interior wall 209 and an exterior wall 211 having flat regions 213 which form side walls 215 (FIG. 2) that are adapted to couple to processing chambers or load lock chambers. In at least one embodiment, each side wall 215 (FIG. 2) may, for example, have a thickness of about two inches at its thinnest point (e.g., the center of each flat region 213). Other side wall thicknesses may be employed. Each side wall 215 may include one or more respective slits 217 (FIG. 3) through which a substrate (not shown) may be transferred from the transfer chamber 203 to a processing chamber 17, or vice versa, by the substrate handling robot 205. A slit valve (not shown in FIGS. 2 and 3) may be associated with each slit 217 to selectively open and close each slit 217. In the embodiment of FIGS. 2 and 3, the transfer chamber 203 includes two slits 217a, 217b for allowing substrates to be loaded into and out of the load lock chamber 15 at two different heights. The slits 217a, 217b may be sealed, for example, via conventional gate valves 219a, 219b (FIG. 2).

Although not shown in FIG. 2 or 3, the transfer chamber 203 may employ slit valve actuators internal to the transfer chamber 203, such as the slit valve actuator 33 of FIG. 1, to seal or open the slits 217 (e.g., a conventional 45 degree-type slit valve). Alternatively, in at least one embodiment, conventional gate valves (e.g., external gate valve 221 (FIG. 2) that moves vertically) may be positioned outside the transfer chamber 203 to seal and open the slits 217. Such a configuration may simplify the design of the domed bottom (described below) of the transfer chamber 203.

Referring again to FIG. 3, the inventive transfer chamber 203 may also include a top member 223 which is annularly shaped, and is adapted to be sealingly joined to an upper portion of the main body 207 via a first O-ring 225. The inventive transfer chamber 203 may also include a lid 227 which is provided to sealingly close an aperture 229 of the top member 223 via a second O-ring 231. Other sealing mechanisms may be employed as may other configurations for sealing the top of the transfer chamber 203.

In accordance with the invention, the transfer chamber 203 also includes a bottom member 233 which has a domed configuration, as best seen in FIG. 2. As will be observed from FIG. 2, the bottom member 233 has a concave configuration such that a vertical distance between the lid 227 of the transfer chamber 203 and a central portion of the bottom member 233 is greater than a vertical distance between the lid 227 and an outer edge of the bottom member 233. In one embodiment of the invention, the bottom member 233 may be machined from a single piece of material such as stainless steel. Other materials and/or configurations may be used. Techniques that may be employed to manufacture the bottom member 233 are disclosed, for example, in co-pending U.S. patent application Ser. No. 09/523,366, filed Mar. 10, 2000 and entitled "Vacuum Processing System for Producing Components", which is incorporated herein by reference in its entirety. Such techniques may include, for example, spinning, rolling and/or the like.

In one embodiment, the bottom member 233 may have a thickness of about 0.5 to 0.625 inches (e.g., in the domed region), as compared to a thickness of three inches for conventional bottom members having a flat configuration and of comparable size (e.g., with an outer diameter of about 2.6 meters). Other thicknesses may be employed.

Referring again to FIG. 3, the bottom member 233 is adapted to couple to and seal a bottom portion of the main body 207 via an outer edge 235 of the bottom member 233 and a third O-ring 237. The bottom member 233 has a generally circular central aperture 239. The outer edge 235 and central aperture 239 may be thicker than the remainder of the bottom member 233 (e.g., about two inches square in the above described embodiment) and may be separately formed and attached to the domed region (e.g., via welding). Various openings and/or surface features 241 may be provided to accommodate sensors, vacuum ports, gas ports, etc. An annular plug member 243 is provided to seal the central aperture 239 of the bottom member 233 via a fourth O-ring 245. The plug member 243 has a central aperture 247 sized to sealingly accommodate a portion of the substrate handling robot 205 (FIG. 2) which extends through the central aperture 247 of the plug member 243 and through the central aperture 239 of the bottom member 233. A fifth O-ring 249 (FIG. 3) seals the central aperture 247 of the plug member 243 around the robot 205. Other sealing mechanisms may be employed in place of or in addition to the O-rings 237, 245 and 249.

The present invention provides for a transfer chamber in which the bottom has a domed configuration. Consequently, for a given size of transfer chamber, the domed bottom can be formed of thinner material than a conventional flat bottom. As a result, the cost and weight of the transfer chamber bottom can be reduced. This may be particularly significant in the case of very large transfer chambers of the type employed with processing tools which process glass plates for fabrication of flat panel displays. Such a design may consume unused space underneath a transfer chamber and does not interfere with overhead height limitations (e.g., due to overhead factory transport systems, ceiling heights, etc.).

As the flat panel industry continues to mature, the size of the glass plates transferred within a transfer chamber (such as the transfer chamber 203) continues to grow. Current glass plate sizes are in the range of about 0.5 to 1.5 meters per side. However, larger glass substrates are being developed (e.g., about 2–3 meters per side). Increasing glass plate size requires transfer chambers of increasing diameter (and larger load lock and process chambers for processing such larger substrates). In the near future, the flat regions of a transfer chamber (e.g., flat regions 213 in FIG. 3) may reach dimensions of greater than about 2–4 meters to accommodate similarly sized glass substrates. As transfer, load lock and process chamber sizes increase, numerous factors should be considered during transfer chamber design, such as robot size, volume of the transfer chamber, space available underneath the transfer chamber, vacuum forces generated within the transfer chamber, weight of the transfer chamber, cost of the transfer chamber and the like.

Figure 4:
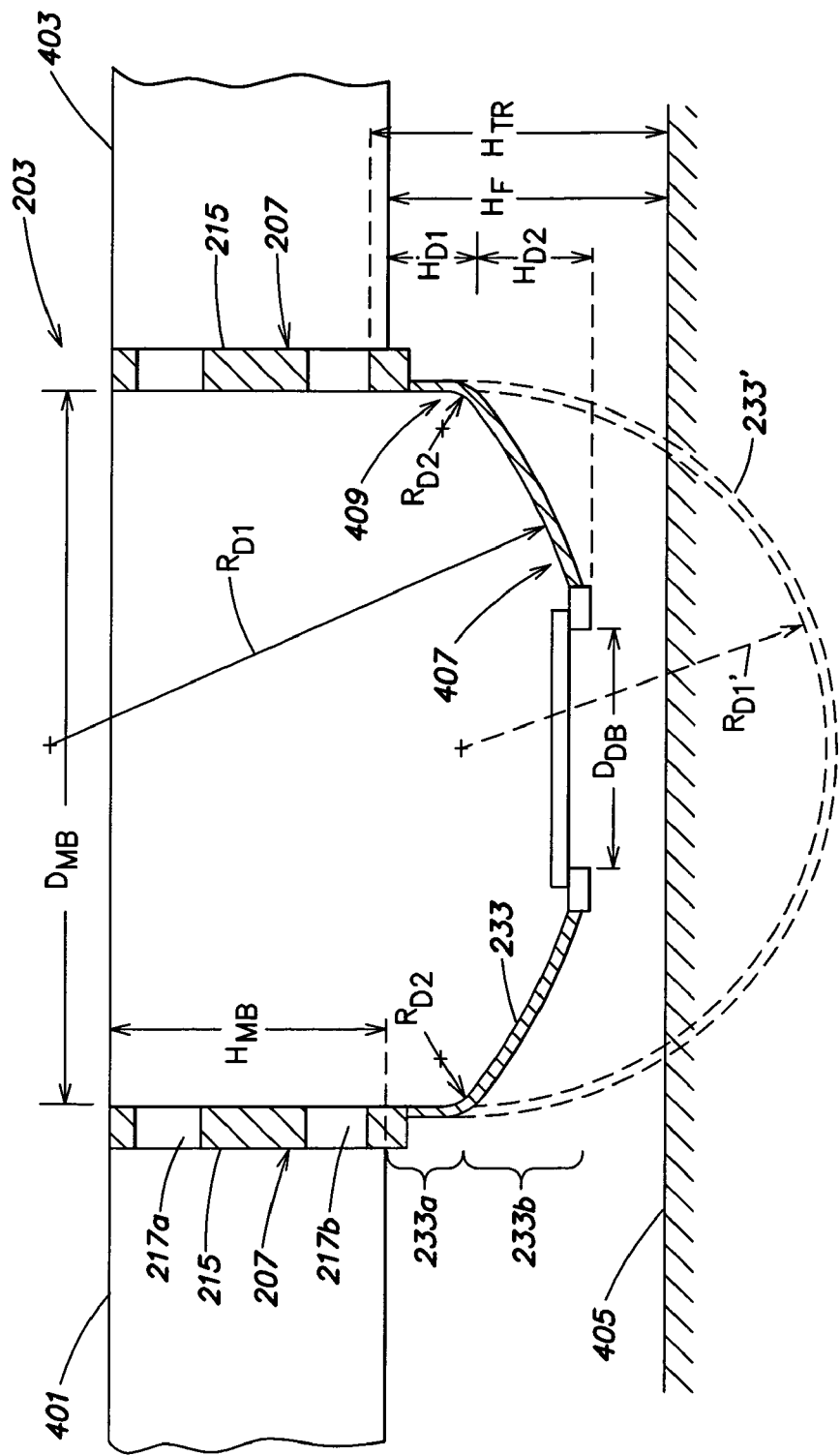
FIG. 4 is a simplified schematic side view of an exemplary embodiment of the transfer chamber of FIGS. 2 and 3.

FIG. 4 is a simplified schematic side view of an exemplary embodiment of the transfer chamber 203 of FIGS. 2 and 3. In FIG. 4, the transfer chamber 203 is coupled to at least one load lock chamber 401 and at least one process chamber 403, and includes the main body 207 as previously described. For clarity, support structure for the transfer chamber 203, and load lock and process chambers 401, 403, is not shown in FIG. 4.

One parameter relevant to the design of the transfer chamber 203 is the space available underneath the transfer chamber 203 to accommodate the domed bottom 233. With reference to FIG. 4, the transfer chamber 203 has a minimum transfer height $H_{TR}$ which represents the minimum height at which a substrate may be transferred within the transfer chamber 203. The minimum transfer height $H_{TR}$ may be an industry standard, a requirement of the fabrication facility employing the transfer chamber 203, or the like. In the example of FIG. 4, the minimum transfer height $H_{TR}$ is defined relative to a floor 405 of a facility (not shown) in which the transfer chamber 203 is located. The floor 405 may be, for example, a floor of a clean room, a raised floor or any other lower limit on the space/area/height located below the transfer chamber 203.

The minimum transfer height $H_{TR}$ sets the height ($H_F$) that the transfer chamber 203 is positioned above the floor 405. The volume below the transfer chamber 203 that may be employed to accommodate the domed bottom 233 is approximately the volume of a cylinder having a diameter equal to the inner diameter of the main body 207 of the transfer chamber 203 ($D_{MB}$) and a height equal to the height of the transfer chamber 203 above the floor 405 ($H_F$).

As shown in FIG. 4, the domed bottom 233 of the transfer chamber 203 includes a cylindrical region 233a having a height $H_{D1}$ and a domed region 233b having a height $H_{D2}$. Accordingly, the volume of the domed bottom 233 is approximately equal to the volume of the cylindrical region 233a plus the volume of the domed region 233b.

It is often preferable that the transfer chamber 203 have as small a volume as possible (e.g., to reduce pump down times thereby increasing throughput). Because a domed configuration defines a smaller volume than a cylindrical configuration (within the same predefined spatial region), from a volume consideration, it may be desirable to maximize the portion of the transfer chamber 203 that is domed (e.g., making the domed region 233b of the domed bottom 233 larger while reducing both the height $H_{D1}$ of the cylindrical region 233a of the domed bottom 233 and the height $H_{MB}$ of the main body 207). However, other factors influence the selection of the height $H_{MB}$ of the main body 207 and the height $H_{D1}$ of the cylindrical region 233a of the domed bottom 233. For example, the height $H_{MB}$ of the main body 207 of the transfer chamber 203 should be sufficient to accommodate any load lock chamber and/or process chamber coupled to the main body 207. In at least one embodiment of the invention, the height $H_{MB}$ of the main body 207 may be set, for example, based on the minimum height required to accommodate the slit openings 217a, 217b that interface with the load lock chamber 401.

With regard to the height $H_{D1}$ of the cylindrical region 233a of the domed bottom 233, the height $H_{D1}$ should be sufficient to accommodate the height of the substrate transfer robot 205 (FIG. 2). As shown in FIG. 2, the substrate transfer robot 205 includes a first arm 205a and a second arm 205b. When the substrate transfer robot 205 is positioned to transfer a substrate at a height near the minimum transfer height $H_{TR}$, such as through the opening 217b of the main body 207 of the transfer chamber 203, the height $H_{D1}$ of the cylindrical region 233a of the domed bottom 233 should be large enough to prevent the second arm 205b of the robot 205 from extending into the domed region 233b of the domed bottom 233 (whether the robot 205 is in a retracted position as shown in FIG. 2 or in an extended position such as is shown by the robot 31 of FIG. 1). If the height $H_{D1}$ of the cylindrical region 233a of the domed bottom 233 is not large enough to prevent the second arm 205b from extending into the domed region 233b of the domed bottom 233, the domed region 233b may contact and interfere with operation of the second arm 205b. As glass substrate size and transfer chamber size increase, stiffness (and thus thickness) of each robot arm 205a, 205b typically increases. A corresponding increase in the height $H_{D1}$ of the cylindrical region 233b of the domed bottom 233 may be employed to compensate for increased robot arm size.

Another factor that may affect the design of the transfer chamber 203 is the strength required for the domed bottom 233. As transfer chamber size increases, so does the force exerted on the domed bottom 233 when the transfer chamber 203 is evacuated. Vacuum forces are most pronounced at the outer edge 235 of the domed bottom 233; and the domed bottom 233 should be sufficiently strong to resist vacuum induced deflections that may affect the ability of the domed bottom 233 to seal relative to the main body 207 of the transfer chamber 203 and/or the robot 205 (FIG. 2).

From a strength standpoint, a spherical configuration for the domed bottom 233 is preferred (as illustrated by domed bottom 233' in FIG. 4). Such a configuration may be achieved by employing a radius of curvature ($R_{D1'}$) of one half of the main body 207's diameter ($D_{MB}$). However, as shown in FIG. 4, a spherical configuration for the domed bottom 233 requires more space underneath the transfer chamber 203 (e.g., and may interfere with the floor 405 or another space limitation) and results in a transfer chamber having a large volume. To reduce the space/volume requirements of the domed bottom 233, a larger radius of curvature ($R_{D1}$) may be employed for a first portion 407 of the domed region 233a of the domed bottom 233. In at least one embodiment, the radius of curvature $R_{D1}$ of the first portion 407 of the domed bottom 233 is greater than one half of the diameter $D_{MB}$ of the main body 207 of the transfer chamber 203. In one particular embodiment, the radius of curvature $R_{D1}$ is about 1.5 times the diameter $D_{MB}$ of the main body 207 of the transfer chamber 203. Other values may be employed. Selection of the radius of curvature $R_{D1}$ may depend on many factors such as the space available under the transfer chamber 203, the strength of the material employed for the domed bottom 233, etc.

When the radius of curvature $R_{D1}$ of the first portion 407 of the domed bottom 233 is greater than one half of the diameter $D_{MB}$ of the main body 207 of the transfer chamber 203, the domed bottom 233 may be provided with a second radiused portion 409 having a radius of curvature $R_{D2}$. This additional radius of curvature compensates for the mismatch between the radius of curvature $R_{D1}$ of the first portion 407 of the domed bottom 233 and the radius of the main body 207 (one half of $D_{MB}$). In at least one embodiment of the invention, the radius of curvature $R_{D2}$ of the second portion 409 is approximately 5–20 times the thickness of the domed bottom 233 (at its thinnest point).

Based on the foregoing and in accordance with the present invention, the transfer chamber 203 and/or the domed bottom 233 may be designed as follows:

(1) determine the space underneath the transfer chamber 203 available for the domed bottom 233 (e.g., based on minimum transfer height $H_{TR}$ and/or the height $H_F$ of the transfer chamber 203 above any interfering structure such as the floor 405);

(2) determine the radius of curvature $R_{D1}$ for the first portion 407 of the domed bottom 233 (e.g., based on the height $H_F$ of the transfer chamber 203 above the floor 405, minimum transfer height $H_{TR}$, desired overall size of the transfer chamber 203, dimensions of the robot 205 such as width and height, the amount of deflection of the domed bottom 233 that is tolerable, the vacuum levels to be employed within the transfer chamber 203, etc.);

(3) determine the thickness of the domed bottom 233 (e.g., based on the radius of curvature $R_{D1}$ for the first portion 407 of the domed bottom 233, material strength, the amount of deflection of the domed bottom 233 that is tolerable, the vacuum levels to be employed within the transfer chamber 203, etc.);

(4) determine the height $H_{MB}$ of the main body 207 of the transfer chamber 203 (e.g., based on the size of the load lock and/or process chambers to be coupled to the main body 207, the height required to accommodate the slit openings used to interface the load lock and/or process chambers to be coupled to the main body 207, etc.);

(5) determine the height $H_{D1}$ of the cylindrical region 233a of the domed bottom 233 (e.g., based on the size of the robot 205 such as the thickness of the second arm 205b, the minimum transfer height $H_{TR}$ of the transfer chamber 203, the distance between the second arm 205b and an end effector 205c of the robot 205 (FIG. 2), etc.); and/or (6) determine the radius of curvature $R_{D2}$ for the second portion 409 of the domed bottom 233 (e.g., based on the radius of curvature $R_{D1}$ of the first portion 407 of the domed bottom 233, the height $H_{D1}$ of the cylindrical region 233a of the domed bottom 233, etc.)

Any of the above factors may be employed alone or in combination, and in any order for designing one or more of the transfer chamber 203 and/or the domed bottom 233. Other factors may be considered during design of the transfer chamber 203 and/or the domed bottom 233, such as the diameter ($D_{DB}$) of the aperture required to accommodate the robot 205, the affect of such an aperture on domed bottom strength, or the like.

In one exemplary embodiment of the invention, the transfer chamber 203 is configured as follows:

(1) diameter $D_{MB}$ of the main body 207 equals about 2.6 meters;

(2) height $H_{MB}$ of the main body 207 equals about 0.8 meters;

(3) height $H_{D1}$ of the cylindrical region 233a of the domed bottom 233 equals about 6 inches;

(4) height $H_{D2}$ of the domed region 233b of the domed bottom 233 equals about 12 inches;

(5) thickness of the cylindrical and domed regions 233a, 233b of the domed bottom 233 equals about 0.5–0.625 inches;

(6) radius of curvature $R_{D1}$ of the radiused portion 407 of the domed bottom 233 equals about 1.5 times the diameter of the main body 207;

(7) radius of curvature $R_{D2}$ of the radiused portion 409 of the domed bottom 233 equals about 5–20 times the thickness of the domed region 233b; and (8) thickness of the main body 207 equals about 2 inches (at its thinnest point).

Other transfer chamber configurations may be employed.

Referring again to FIG. 2, exemplary support structure 241 for the transfer chamber 203 and/or the robot 205 is illustrated. Such support structure may include, for example, one or more suitably sized pedestal legs 243, cross members 245 and/or braces 247. In general, any mechanism for supporting the transfer chamber 203 or the robot 205 may be employed. The load lock chamber 15 may be supported, for example, via a clean room wall 249 and/or the transfer chamber 205; and the processing chamber 17 may be supported, for example, by one or more pedestals 251 and/or cross members 253. Other supporting configurations may be employed.

In at least one embodiment of the invention, the support structure 241 is adapted to support the main body 207 of the transfer chamber 203 and the robot 205 without directly supporting the domed bottom 233. For example, pedestals 243 may interface with flat regions 213 (FIG. 3) of the main body 207 without contacting the domed bottom 233; and cross members 245 and braces 247 may support a main trunk 255 of the robot 205 without contacting the domed bottom 233 (as shown). The domed bottom 233 may be supported by the main body 207 (e.g., by hanging therefrom, such as via bolts or other fastening mechanisms not shown).

In the above described embodiment, the domed bottom 233 is isolated from the support structure 241 of the main body 207 and the robot 205 (and is "floating" relative to the main body 207 and the robot 205). Further in accordance with the above embodiment of the invention, a conventional bellows seal (not shown) may be employed between the domed bottom 233 and the robot 205 to allow the domed bottom 233 to move vertically relative the robot 205 without breaking a vacuum seal formed therebetween (e.g., via the o-rings 245, 249 in FIG. 3). In this manner, the domed bottom 233 is free to deflect during evacuation and venting of the transfer chamber 203, and fewer design constraints (e.g., in terms of material thickness, strength, etc.) are placed on the design of the domed bottom 233. Further, deflections of the domed bottom 233 will not affect the position and/or calibration of the robot 205.

Figure 5:
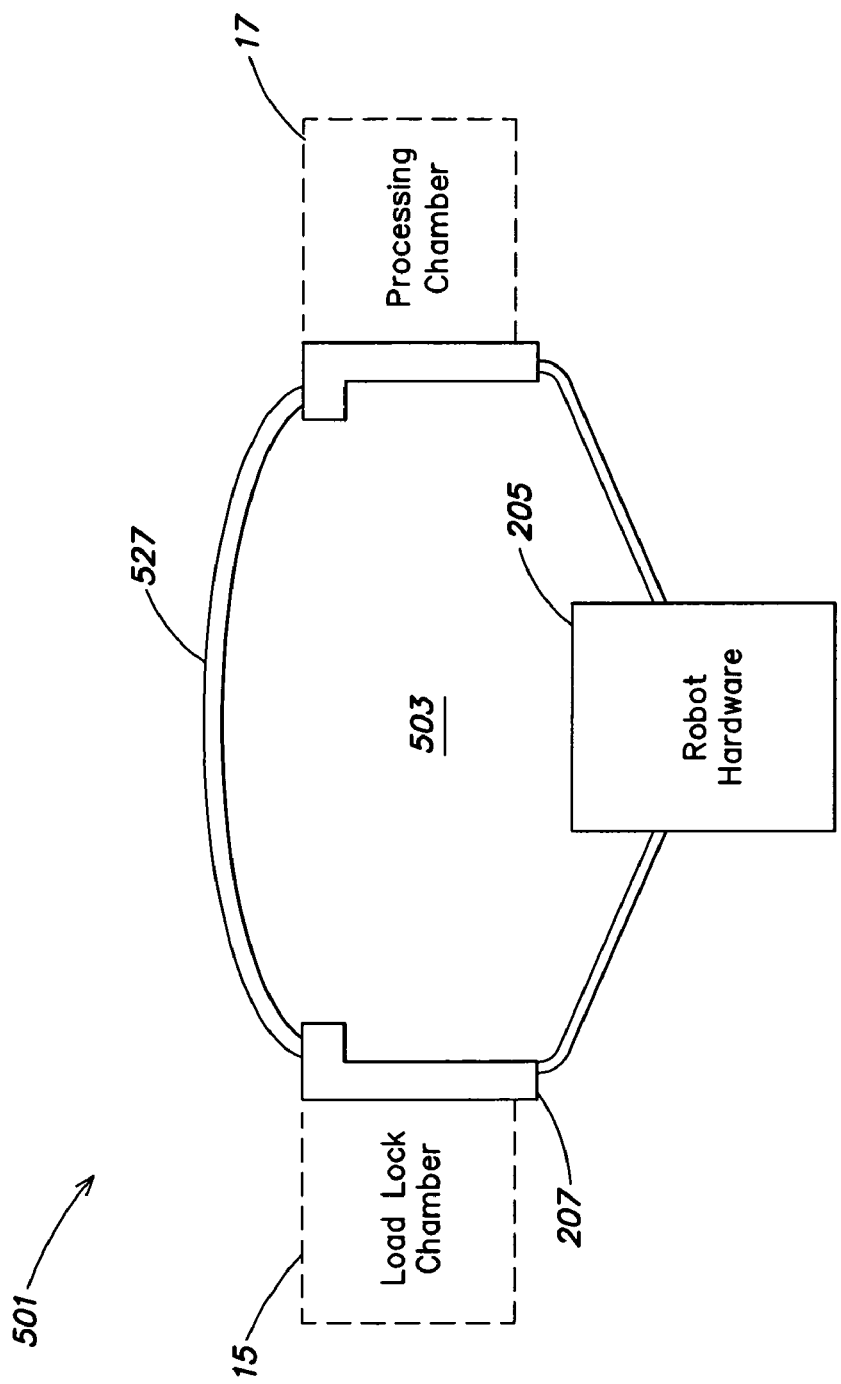
FIG. 5 is a schematic vertical cross-sectional view of a vacuum processing system provided in accordance with another embodiment of the invention.

FIG. 5 is a schematic vertical cross-sectional view of a processing tool 501 provided in accordance with an alternative embodiment of the invention. The alternative inventive processing tool 501 may be the same in all respects as the inventive processing tool 201 shown in FIG. 2 except that the processing tool 501 of FIG. 4 may have a transfer chamber 503 which has a lid 527 provided in a domed configuration (instead of employing the flat transfer chamber lid 227 shown in FIGS. 2 and 3). A transfer chamber lid having a domed configuration is disclosed in the above-referenced patent application Ser. No. 09/523,366.

The foregoing description discloses only exemplary embodiments of the invention; modifications of the above disclosed apparatus which fall within the scope of the invention will be readily apparent to those of ordinary skill in the art. For example, although the inventive domed transfer chamber bottom has been illustrated above as having a concave configuration, the domed transfer chamber bottom may alternatively have a convex configuration (i.e., such that a vertical distance between a central portion of the domed bottom and the lid of the transfer chamber is less than a vertical distance between an outer edge of the domed bottom and the lid of the transfer chamber). As used herein, a "domed" bottom or lid need only have a portion thereof, such as an outer portion, domed or curved. The remainder of the bottom or lid may assume other shapes and/or may be flat. Such a domed bottom (or lid) design may be based on one or more of transfer chamber height or width, the height or width available underneath a transfer chamber, or the like.

It should further be recognized that if a domed lid is employed, as shown in the embodiment of FIG. 5, the configuration of the lid may be convex (as also disclosed in the above-referenced U.S. patent application Ser. No. 09/523,366) rather than the concave lid configuration shown in FIG. 5.

Although the present invention is particularly advantageous when applied to a large transfer chamber of the type used in processing glass plates, the invention is also applicable to other types of processing tools, including those used to process silicon wafers. The invention is applicable to transfer chambers adapted to couple to any number of processing chambers and to any number of load lock chambers.

It should be understood that at least some of the transfer chamber components illustrated in FIG. 3 can be combined with other components. For example, the lid 227 and the top member 223 can be combined to form a single piece that sealingly closes the top of the main body 207 of the transfer chamber 203. Accordingly, as used in the appended claims, the term "lid" should be understood to include one, two or more pieces which seal the top of a transfer chamber. It is also contemplated that components of the inventive transfer chamber shown as a single piece in FIG. 3 may be constituted by two or more pieces.

As another alternative, the bottom member 233 and the plug member 243 could be combined to form a single integral piece that seals around a substrate handling robot.

The inventive transfer chamber may be arranged to accommodate any type of substrate handling robot, including a "frog leg" style robot.

If the bottom of the transfer chamber is employed to support the weight of the main body of the transfer chamber and/or a portion of the weight of each load lock and process chamber coupled to the transfer chamber (e.g., if the domed bottom is not floating relative to the main body), the design of the domed bottom may be affected (e.g., the height of the non-domed portion of the bottom, the radii of the domed portion of the bottom, material thickness, etc.).

Accordingly, while the present invention has been disclosed in connection with exemplary embodiments thereof, it should be understood that other embodiments may fall within the spirit and scope of the invention, as defined by the following claims.

What is claimed is:

1. A transfer chamber comprising:
    a main body having sidewalls adapted to couple to at least one processing chamber and at least one load lock chamber and to house at least a portion of a robot adapted to transport a substrate between the at least one processing chamber and the at least one load lock chamber;
    a lid adapted to couple to and to seal a top portion of the main body of the transfer chamber; and
    a domed bottom adapted to couple to and to seal a bottom portion of the rain body of the transfer chamber;
    wherein the domed bottom includes a domed region having a radius of curvature greater than a radius of the main body.

2. The transfer chamber of claim 1 wherein the main body comprises a cylindrical interior wall and an exterior wall having a plurality of flat regions each adapted to couple to at least one of a load lock chamber and a processing chamber.

3. The transfer chamber of claim 2 wherein the main body is machined from a single piece of material.

4. The transfer chamber of claim 3 wherein the main body comprises aluminum.

5. The transfer chamber of claim 4 wherein the sidewalls of the main body have a minimum thickness of about 2 inches.

6. The transfer chamber of claim 1 wherein the lid is substantially flat.

7. The transfer chamber of claim 1 wherein the lid is domed.

8. The transfer chamber of claim 1 wherein the domed bottom is machined from a single piece of material.

9. The transfer chamber of claim 8 wherein the domed bottom comprises stainless steel.

10. The transfer chamber of claim 9 wherein the domed bottom has a minimum thickness of about 0.625 inches.

11. The transfer chamber of claim 1, wherein the domed bottom has a concave configuration such that a vertical distance between the lid and a central portion of the domed bottom is greater than a vertical distance between the lid and an outer edge of the domed bottom.

12. A vacuum processing system, comprising:
a transfer chamber comprising:
a main body having sidewalls adapted to couple to at least one processing chamber and at least one load lock chamber and to house at least a portion of a robot adapted to transport a substrate between the at least one processing chamber and the at least one load lock chamber;
a lid adapted to couple to and to seal a top portion of the main body of the transfer chamber; and
a domed bottom adapted to couple to and to seal a bottom portion of the main body of the transfer chamber;
wherein the domed bottom includes a domed region having a radius of curvature greater than a radius of the main body;
at least one processing chamber coupled to the main body of the transfer chamber;
at least one load lock chamber coupled to the main body of the transfer chamber; and
a robot at least partially extending through the domed bottom into the transfer chamber, the robot adapted to transport a substrate between the at least one processing chamber and the at least one load lock chamber via the transfer chamber.

13. The system of claim 12 wherein the main body comprises a cylindrical interior wall and an exterior wall having a plurality of flat regions each adapted to couple to at least one of a load lock chamber and a processing chamber.

14. The system of claim 13 wherein the main body of the transfer chamber is machined from a single piece of material.

15. The system of claim 14 wherein the main body of the transfer chamber comprises aluminum.

16. The system of claim 15 wherein the sidewalls of the main body of the transfer chamber have a minimum thickness of about 2 inches.

17. The system of claim 12 wherein the lid of the transfer chamber is substantially flat.

18. The system of claim 12 wherein the lid of the transfer chamber is domed.

19. The system of claim 12 wherein the domed bottom of the transfer chamber is machined from a single piece of material.

20. The system of claim 19 wherein the domed bottom of the transfer chamber comprises stainless steel.

21. The system of claim 20 wherein the domed bottom of the transfer chamber has a minimum thickness of about 0.625 inches.

22. The system of claim 12, wherein the domed bottom of the transfer chamber has a concave configuration such that a vertical distance between the lid of the transfer chamber and a central portion of the domed bottom is greater than a vertical distance between the lid and an outer edge of the domed bottom.

23. A method of forming a domed bottom for a transfer chamber adapted to couple at least one load lock chamber to at least one processing chamber, the method comprising:
selecting a material; and
forming a domed bottom from the material, the domed bottom having an outer diameter sized to fit against and configured to form a seal with a bottom portion of a main body of a transfer chamber wherein the domed bottom is adapted to have a domed region with a radius of curvature greater than a radius of the main body and an aperture having a diameter sized to accommodate at least a portion of a robot adapted to transfer substrates between at least one load lock chamber and at least one processing chamber coupled to the transfer chamber.

24. The method of claim 23 wherein the material is stainless steel.

25. A transfer chamber comprising:
a main body having sidewalls adapted to couple to at least one processing chamber and at least one load lock chamber and to house at least a portion of a robot adapted to transport a substrate between the at least one processing chamber and the at least one load lock chamber;
a lid adapted to couple to and to seal a top portion of the main body of the transfer chamber; and
a domed bottom adapted to couple to and to seal a bottom portion of the main body of the transfer chamber;
wherein the domed bottom includes:
a cylindrical region having a height adapted to accommodate at least a portion of an arm of a robot positioned within the transfer chamber; and
a domed region having:
a first radiused portion having a first radius of curvature; and
a second radiused portion extending between the first radiused portion and the cylindrical region and having a second radius of curvature that is less than the first radius of curvature;
wherein the first radius of curvature is greater than a radius of the main body.

26. The transfer chamber of claim 25 wherein the first radius of curvature is about 1.5 times a diameter of the main body.

27. The transfer chamber of claim 25 wherein the second radius of curvature is about 5–20 times a thickness of the domed region.

28. A method of forming a domed bottom for a transfer chamber adapted to couple at least one load lock chamber to at least one processing chamber, the method comprising:
selecting a material; and
forming a domed bottom from the material, the domed bottom having:
a cylindrical region having a height adapted to accommodate at least a portion of an arm of a robot positioned within the transfer chamber; and
a domed region having:
a first radiused portion having a first radius of curvature; and
a second radiused portion extending between the first radiused portion and the cylindrical region and having a second radius of curvature that is less than the first radius of curvature;
wherein the first radius of curvature is greater than a radius of the main body.

29. A method of transporting substrates, comprising:
providing a transfer chamber having:
- a main body having sidewalls adapted to couple to at least one processing chamber and at least one load lock chamber and to house at least a portion of a robot adapted to transport a substrate between the at least one processing chamber and the at least one load lock chamber;
- a lid adapted to couple to and to seal a top portion of the main body of the transfer chamber; and
- a domed bottom adapted to couple to and to seal a bottom portion of the main body of the transfer chamber;
    wherein the domed bottom includes a domed region having a radius of curvature greater than a radius of the main body;
providing a substrate to the transfer chamber; and
employing the transfer chamber to transport the substrate during electronic device manufacturing.

30. The method of claim 29 wherein employing the transfer chamber to transport the substrate during electronic device manufacturing comprises employing the transfer chamber to transport the substrate during flat panel display manufacturing.

* * * * *

UNITED STATES PATENT AND TRADEMARK OFFICE
CERTIFICATE OF CORRECTION

| | |
|---|---|
| PATENT NO. | : 7,018,517 B2 |
| APPLICATION NO. | : 10/601185 |
| DATED | : March 28, 2006 |
| INVENTOR(S) | : Shinichi Kurita |

It is certified that error appears in the above-identified patent and that said Letters Patent is hereby corrected as shown below:

Column 10, line 37, "a main body having sidewalls adapted to couple to at least" should be changed to "a main body having sidewalls coupled to at least"

Column 10, line 39, "chamber and to house at least a portion of a robot" should be changed to "chamber and housing at least a portion of a robot"

Column 10, Line 40, "adapted to transport a substrate betwee the at least one" should be changed to "that transports a substrate between the at least one"

Column 10, line 43, "a lid adapted to couple to and to seal a top portion of the" should be changed to "a lid that couples to and seals a top portion of the"

Column 10, line 45, "a domed bottom adapted to couple to and to seal a bottom" should be changed to "a domed bottom that couples to and seals a bottom"

Column 11, line 12, "a main body having sidewalls adapted to couple to at" should be changed to "a main body having sidewalls coupled to at"

Column 11, line 14, "lock chamber and to house at least a portion of a" should be changed to "lock chamber and housing at least a portion of a"

Column 11, line 15, "robot adapted to transport a substrate between the at" should be changed to "robot that transports a substrate between the at"

Column 11, line 18, "a lid adapted to couple to and to seal a top portion of" should be changed to "a lid that couples to and seals a top portion"

Column 11, line 20, "a domed bottom adapted to couple to and to seal a" should be changed to "a domed bottom that couples to and seals a"

Column 11, line 25, "the main body;" should be changed to "the main body; and"

Column 11, delete lines 26-29, which begin with "at least one processing chamber..." and end with "of the transfer chamber; and"

Column 11, line 31, "bottom into the transfer chamber, the robot adapted to" should be changed to "bottom into the transfer chamber, the robot"

Column 11, line 32, "transport a substrate between the at least one processing" should be changed to "transports a substrate between the at least one processing"

Column 12, line 2, "chamber adapted to couple at least one load lock chamber to" should be changed to "chamber coupled to at least one load lock chamber and to"

Signed and Sealed this
Twenty-seventh Day of September, 2011

David J. Kappos
*Director of the United States Patent and Trademark Office*

CERTIFICATE OF CORRECTION (continued)

Column 12, line 9, "bottom is adapted to have a domed region with a radius" should be changed to "bottom has a domed region with a radius"

Column 12, line 12, "least a portion of a robot adapted to transfer substrates" should be changed to "least a portion of a robot that transfers substrates"

Column 12, line 18, "a main body having sidewalls adapted to couple to at least" should be changed to "a main body having sidewalls coupled to at least"

Column 12, line 20, "chamber and to house at least a portion of a robot" should be changed to "chamber and houses at least a portion of a robot"

Column 12, line 21, "adapted to transport a substrate between the at least one" should be changed to "that transports a substrate between the at least one"

Column 12, line 24, "a lid adapted to couple to and to seal a top portion of the" should be changed to "a lid that couples to and seals a top portion of the"

Column 12, line 26, "a domed bottom adapted to couple to and to seal a bottom" should be changed to "a domed bottom that couples to and seals a bottom"

Column 12, line 29, "a cylindrical region having a height adapted to accom-" should be changed to "a cylindrical region having a height that accom-"

Column 12, line 30, "modate at least a portion of an arm of a robot" should be changed to "modates at least a portion of an arm of a robot"

Column 12, line 48, "chamber adapted to couple at least one load lock chamber to" should be changed to "chamber coupled to at least one load lock chamber and to"

Column 12, line 53, "a cylindrical region having a height adapted to accom-" should be changed to "a cylindrical region having a height that accom-"

Column 12, line 54, "modate at least a portion of an arm of a robot" should be changed to "modates at least a portion of an arm of a robot"

Column 13, line 3, "a main body having sidewalls adapted to couple to at" should be changed to "a main body having sidewalls coupled to at"

Column 13, line 5, "lock chamber and to house at least a portion of a" should be changed to "lock chamber and housing at least a portion of a"

Column 13, line 6, "robot adapted to transport a substrate between the at" should be changed to "robot that transports a substrate between the at"

Column 13, line 9, "a lid adapted to couple to and to seal a top portion of" should be changed to "a lid that couples to and seals a top portion of"

Column 13, line 11, "a domed bottom adapted to couple to and to seal a" should be changed to "a domed bottom that couples to and seals a"